United States Patent
Jagannathan et al.

(10) Patent No.: US 10,229,986 B1
(45) Date of Patent: Mar. 12, 2019

(54) VERTICAL TRANSPORT FIELD-EFFECT TRANSISTOR INCLUDING DUAL LAYER TOP SPACER

(71) Applicant: International Business Machines Corporation, Armonk, NY (US)

(72) Inventors: Hemanth Jagannathan, Niskayuna, NY (US); Choonghyun Lee, Rensselaer, NY (US); Alexander Reznicek, Troy, NY (US); Christopher Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/831,354

(22) Filed: Dec. 4, 2017

(51) Int. Cl.
| | |
|---|---|
| H01L 29/66 | (2006.01) |
| H01L 29/06 | (2006.01) |
| H01L 29/78 | (2006.01) |
| H01L 21/28 | (2006.01) |

(52) U.S. Cl.
CPC .... *H01L 29/6656* (2013.01); *H01L 21/28247* (2013.01); *H01L 29/0653* (2013.01); *H01L 29/6653* (2013.01); *H01L 29/66553* (2013.01); *H01L 29/66666* (2013.01); *H01L 29/7827* (2013.01)

(58) Field of Classification Search
CPC ........... H01L 29/6656; H01L 29/66666; H01L 29/6653; H01L 29/66553; H01L 29/7827; H01L 29/0653; H01L 29/0847; H01L 21/28247; H01L 21/823814; H01L 21/823885

See application file for complete search history.

(56) References Cited

U.S. PATENT DOCUMENTS

| | | | |
|---|---|---|---|
| 7,297,600 | B2 | 11/2007 | Oh et al. |
| 8,637,930 | B2 | 1/2014 | Ando et al. |
| 9,305,835 | B2 | 4/2016 | Alptekin et al. |
| 9,368,572 | B1 | 6/2016 | Cheng et al. |
| 9,443,982 | B1 | 9/2016 | Balakrishnan et al. |
| 9,570,356 | B1 * | 2/2017 | Balakrishnan ............... H01L 21/823487 |
| 9,680,473 | B1 | 6/2017 | Anderson et al. |
| 9,735,246 | B1 | 8/2017 | Basker et al. |
| 9,805,935 | B2 | 10/2017 | Anderson et al. |

(Continued)

OTHER PUBLICATIONS

Hemanth Jagannathan et al., Unpublished U.S. Appl. No. 15/831,340, filed Dec. 4, 2017, entitled Vertical Transport Field-Effect Transistor Including Air-Gap Top Spacer, pp. 1-24 plus 7 sheets formal drawings.

(Continued)

*Primary Examiner* — Laura M Menz
*Assistant Examiner* — Candice Chan
(74) *Attorney, Agent, or Firm* — L. Jeffrey Kelly; Otterstedt, Ellenbogen & Kammer, LLP

(57) ABSTRACT

A vertical transport field-effect transistor includes a top source/drain region separated from an underlying gate stack by a multi-layer top spacer that includes an oxygen barrier layer beneath a top dielectric layer. Techniques for fabricating the transistor include depositing the oxygen barrier layer over the gate stack prior to depositing the top dielectric layer. The oxygen barrier layer blocks oxygen diffusion during deposition of the top dielectric layer, thereby avoiding damage to underlying interfacial and gate dielectric layers.

8 Claims, 7 Drawing Sheets

(56) References Cited

U.S. PATENT DOCUMENTS

| | | |
|---|---|---|
| 9,954,102 B1 * | 4/2018 | Mochizuki .......... H01L 29/6653 |
| 2009/0042347 A1 | 2/2009 | Oyu |
| 2016/0365439 A1 | 12/2016 | Lin et al. |
| 2017/0186742 A1 * | 6/2017 | Balakrishnan .............................. H01L 21/823481 |

OTHER PUBLICATIONS

Paul J. Otterstedt, List of IBM Patents or Patent Applications Treated As Related, pp. 1-2, Dec. 6, 2017.

* cited by examiner

VERTICAL TRANSPORT FIELD-EFFECT TRANSISTOR INCLUDING DUAL LAYER TOP SPACER

BACKGROUND

The present invention relates generally to the electrical, electronic and computer arts and, more particularly, to vertical transistor structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region. Junction field-effect transistors (JFETs) are characterized by doped, possibly vertical channel regions, p-n junctions on one or more sides of the channels, and ohmic contacts forming the source and drain regions.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts.

The growth of top spacers such as silicon nitride spacers during the fabrication of vertical transport field-effect transistors (VTFETs) can impair the reliability of such transistors. Shallow traps caused by damage to interfacial/high-k dielectric layers can cause such impairment of device reliability. Referring to FIG. 13A, an exemplary partially completed VTFET structure includes a semiconductor substrate 21, a semiconductor fin extending vertically with respect to the substrate 21, an epitaxial bottom source/drain layer 26A, and a bottom electrically insulating spacer 28 on the bottom source/drain layer. The bottom spacer is positioned between the bottom source/drain layer and a gate stack including gate dielectric and work function metal (gate electrode) layers 30, 32. An interfacial layer (IL) 31, for example silicon dioxide, forms part of the gate dielectric layer. A high-k dielectric material adjoins the interfacial layer 31. The deposition of a silicon nitride spacer 36 on the structure can result in fin (channel) oxidation, IL regrowth, and damage to the high-k gate dielectric layer, as schematically indicated by the column of x's in FIG. 13B. The method described below provides effective protection against oxygen diffusion and such resulting damage that may occur during top spacer deposition.

BRIEF SUMMARY

A monolithic semiconductor structure including a vertical transport FET and fabrication of such a structure are aspects of inventions disclosed herein.

In one aspect, an exemplary method of fabricating a vertical transport field-effect transistor includes obtaining a first structure including: a vertically extending semiconductor fin including a top region, a bottom region, and a channel region between the top region and the bottom region, a bottom source/drain region adjoining the bottom region of the semiconductor fin, a gate dielectric layer adjoining the channel region of the semiconductor fin, an electrically conductive gate electrode layer adjoining the gate dielectric layer, each of the gate dielectric layer and the gate electrode layer including exposed top edge portions, the top region of the semiconductor fin extending above the exposed top edge portions of the gate dielectric layer and the gate electrode layer, and a bottom electrically insulating spacer between the bottom source/drain region and the gate electrode layer. An oxidation barrier layer is deposited on the first structure and extends over the gate electrode layer and the exposed top edge portions of the gate dielectric layer and the gate electrode layer. A top dielectric layer is deposited on the oxidation barrier layer. The top region of the semiconductor fin is exposed by removing a first portion of the oxidation barrier layer and a first portion of the top dielectric layer above the channel region of the semiconductor fin. A top source/drain region is epitaxially grown on the top region of the semiconductor fin such that a second portion of the oxidation barrier layer and a second portion of the top dielectric layer comprise a top spacer between the top source/drain region and the gate electrode layer.

In a further aspect, a vertical transport field-effect transistor structure includes a substrate and a semiconductor fin extending vertically with respect to the substrate. The semiconductor fin includes a top region, a bottom region, and a channel region between the top region and the bottom region. A bottom source/drain region adjoins the bottom region of the semiconductor fin and a gate dielectric layer adjoins the channel region of the semiconductor fin. The gate dielectric layer includes top edge portions. An electrically conductive gate electrode layer adjoins the gate dielectric layer and includes top edge portions. A bottom dielectric spacer is between the bottom source/drain region and the gate electrode layer. A faceted, epitaxial top source/drain region is on the top region of the semiconductor fin. An oxidation barrier layer extends over the gate electrode layer, the top edge portions of the gate dielectric layer and the gate electrode layer, and a portion of the semiconductor fin between the top source/drain region and the top edge portions of the gate dielectric layer. A top dielectric layer extends over the oxidation barrier layer. A portion of the oxidation barrier layer and a portion of the top dielectric layer comprise a top spacer positioned between the top source/drain region and the gate electrode layer.

A method of fabricating vertical transport transistor structures is further provided and includes providing a monolithic structure including a semiconductor substrate, first and second parallel semiconductor fins, each of the first and second parallel semiconductor fins including a bottom region adjoining the semiconductor substrate, a top region and a channel region between the bottom region and the top region, and a dielectric cap on the top region of each of the first and second semiconductor fins. A bottom source/drain region adjoining the bottom regions of the first and second semiconductor fins is epitaxially grown directly on a top surface of the semiconductor substrate. A bottom electrically insulating spacer is deposited over the bottom source/drain region and a gate dielectric layer is deposited over the bottom electrically insulating spacer and the first and second parallel semiconductor fins. A work function metal layer is deposited directly on the gate dielectric layer. The gate dielectric layer and the work function metal layer are recessed, thereby exposing the top regions of the first and second parallel semiconductor fins and top edge portions of the gate dielectric layer. An oxidation barrier layer is deposited over the work function metal layer, the top regions of the first and second parallel semiconductor fins, the top edge portions of the gate dielectric layer, and the dielectric caps. A top dielectric layer is deposited over the oxidation barrier layer. The oxidation barrier layer and the top dielectric layer are recessed and the dielectric caps are removed from the first and second parallel semiconductor fins. First and second top source/drain regions are grown directly on the top regions of the first and second parallel semiconductor fins such that a portion of the oxidation barrier layer and a portion of the top dielectric layer comprise first and second top spacers positioned respectively between the first and second top source/drain regions and the gate electrode layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;

Protection against oxygen diffusion into channel region during spacer deposition;

Avoidance of interfacial layer (IL) regrowth or damage to high-k gate dielectric layer;

Enhanced reliability.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
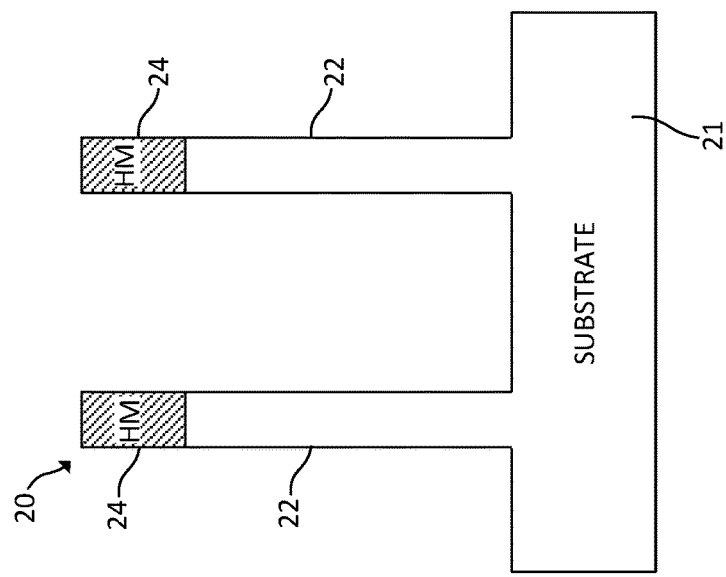
FIG. 1 is a schematic, cross-sectional illustration of a bulk semiconductor substrate including an array of parallel semiconductor fins and dielectric caps on the fins.

A structure 20 including a bulk semiconductor substrate 21 comprised of crystalline silicon is shown in FIG. 1. The substrate may be in the form of a wafer that is essentially undoped. An array of parallel fins 22 is formed from the substrate using, for example, a sidewall image transfer process. A hard mask (not shown) may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Dielectric caps 24 on the top surfaces of the fins 22 are the remaining portions of the hard mask (HM). Silicon nitride caps 24 are formed in some embodiments. While the fins 22 are shown as having vertical side walls and horizontal top surfaces in the schematic illustrations, it will be appreciated that the fins may have somewhat different configurations such as triangular configurations wherein the fin bases are wider than the tops of the fins. The structure 20 may accordingly include fins having sides that are not completely vertical. Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the monocrystalline silicon fins 22 are (110) surfaces. As discussed above, the side walls of the fins 22 may not be exactly vertical. Surfaces described as (110) surfaces herein are at least close to being (110) surfaces but may or may not be exactly (110) surfaces.

It will be appreciated that substrate 21 and fins formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Vertical transport devices can alternatively be formed on a semiconductor-on-insulator (SOI) substrate including a buried insulator layer.

Figure 2:
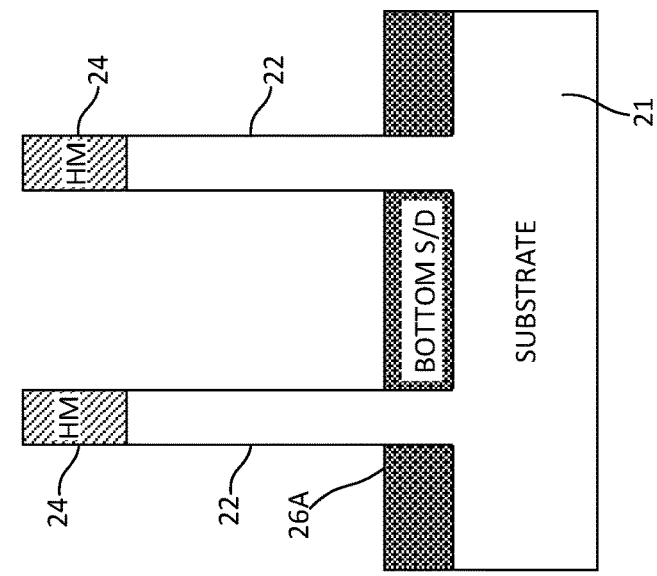
FIG. 2 is a view of the structure shown in FIG. 1 following formation of an epitaxial bottom source/drain layer.

Referring to FIG. 2, a heavily bottom doped source/drain layer 26A can be formed by epitaxial growth on the substrate 21 and bottom regions of the semiconductor fins 22 as discussed further below. The source/drain layer 26A is heavily doped with dopant(s) having a first conductivity type. The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

The bottom source/drain layer 26A is can be formed using a bottom-up epitaxial growth process wherein the heavily doped source/drain layer is grown to certain height (thickness) such as, but not necessarily limited to from about 50 nm to about 250 nm, with about 100 nm to about 200 nm preferred. A fin liner (not shown, e.g. $SiO_2$ or SiN) prevents epitaxial growth from the fin sidewalls within and above the channel regions of the semiconductor fins 22 at this stage of the process. The epitaxially grown source/drain layer 26A can be doped in situ, and dopants may include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be e20/cm$^3$ to e21/cm$^3$, with 4e20/cm$^3$ to 8e20/cm$^3$ preferred. The bottom source/drain layer 26A can include, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). By "in-situ" it is meant that the dopant that dictates the conductivity type of doped layer is introduced during the process step, e.g., epitaxial deposition, that forms the doped layer. The resulting bottom source/drain layer 26A includes an essentially flat top surface. The oxide or nitride fin liner can be removed following completion of the bottom source/drain layer. A diluted hydrofluoric acid (HF) solution may, for example, be employed to remove an oxide liner. Additionally, after bottom source/drain formation, a dopant drive-in anneal (900° C. to 1050° C.) is conducted for junction formation.

Figure 3:
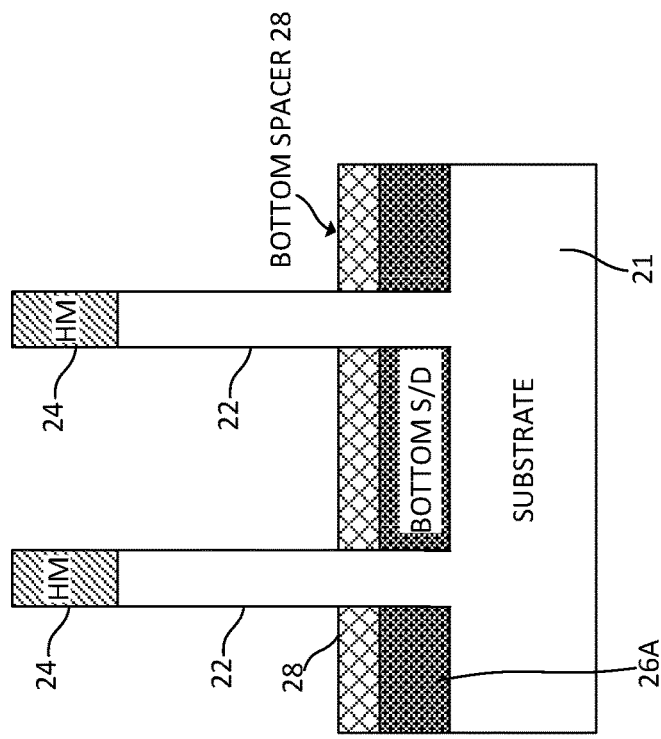
FIG. 3 is a schematic, cross-sectional view showing the structure of FIG. 2 following deposition of a bottom spacer.

A bottom spacer 28 is deposited to obtain a structure as shown in FIG. 3. The bottom spacer may comprise an electrically insulating material, for example, silicon dioxide, silicon nitride, SiOCN, or SiBCN. Other non-limiting examples of materials for the bottom spacer include dielectric oxides (e.g., silicon oxide), dielectric nitrides (e.g., silicon nitride), dielectric oxynitrides, or any combination thereof. The bottom spacer may have a thickness of about five to about ten nanometers, though such a range is not considered critical. The bottom spacer can be deposited directly on the bottom source/drain layer 26A using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 4:
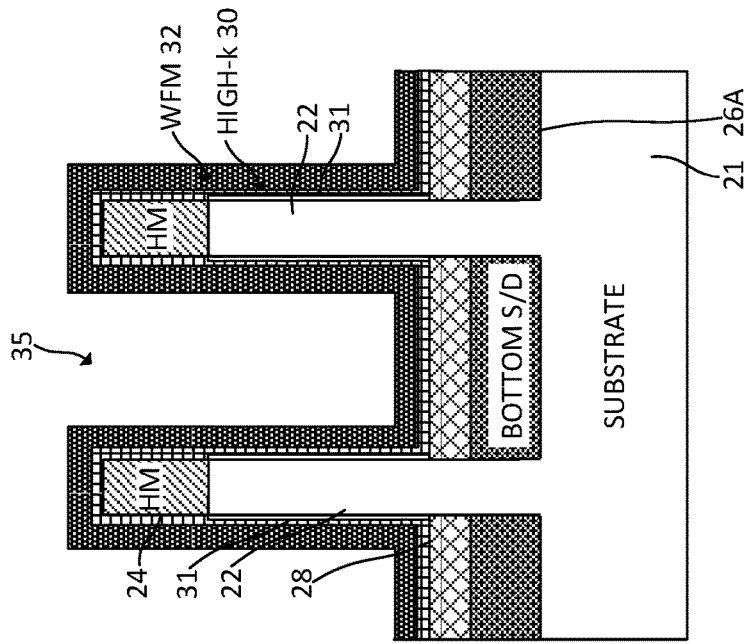
FIG. 4 is a schematic, cross-sectional view showing the structure of FIG. 3 following deposition of gate dielectric and gate metal materials.

A gate dielectric layer 30 and a work function metal (WFM) layer 32 are deposited sequentially to form a gate stack for the VTFET device, as schematically illustrated in FIG. 4. The gate dielectric layer adjoins the bottom spacer 28, the sidewalls of the semiconductor fins 22, and the dielectric caps 24 on the fins. Non-limiting examples of suitable materials for the gate dielectric layer 30 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 30 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

The work function metal layer 32 is disposed over the gate dielectric layer to obtain a structure 35 as shown in FIG. 4. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering. A gate-all-around (GAA) structure for the VTFET is thereby obtained, wherein the WFM is functional as a gate electrode.

Figure 6:
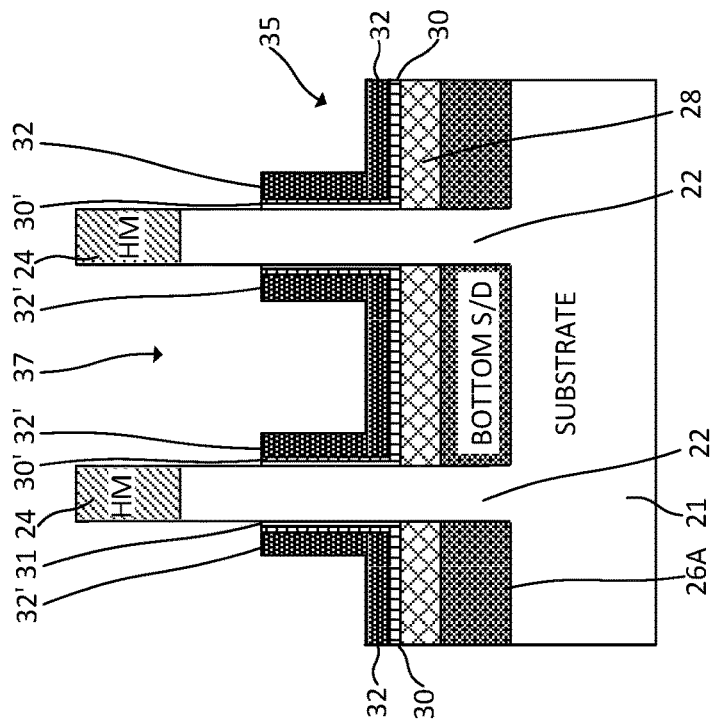
FIG. 6 is a schematic, cross-sectional view showing the structure of FIG. 5 following removal of the organic planarization layer.
Figure 5:
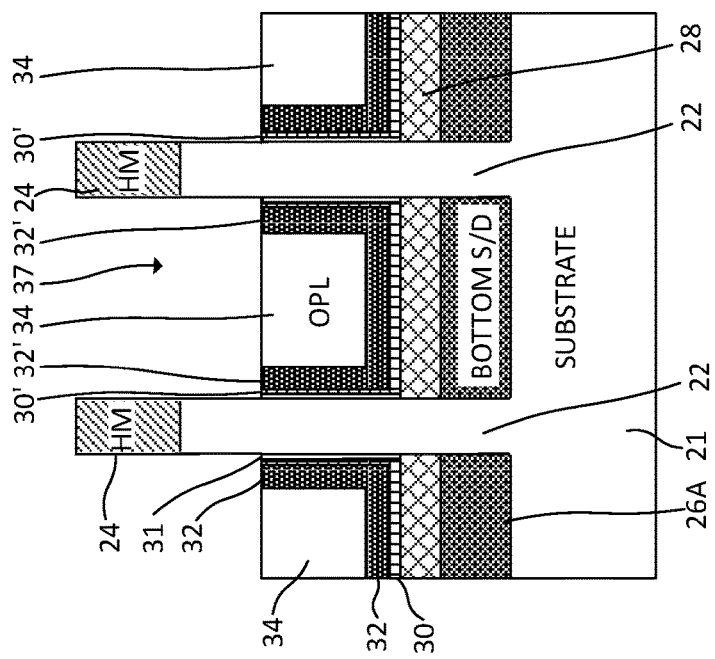
FIG. 5 is a schematic, cross-sectional view showing the structure of FIG. 4 following deposition of an organic planarization layer (OPL) and recessing of the gate dielectric and gate metal materials.

An organic planarization layer (OPL) 34 is deposited on the structure and then recessed down to the channel regions of the semiconductor fins 22. Sequential wet or dry etches, or combinations thereof, can be employed for etching the work function metal and gate dielectric materials to form cavities 37 between the semiconductor fins. Timed etches may be employed. The remaining vertical portions of the gate dielectric layer and work function metal layer 32 adjoin the channel regions of the semiconductor fins. Top portions of the semiconductor fins 22 and the fin caps 24 extend above the gate stacks (30/32). The remaining portions of the OPL layer are then removed by ashing or other suitable process, thereby obtaining a structure 35 as shown in FIG. 6. The layer of work function material on the structure 35 is exposed. The top edge of the underlying gate dielectric layer 30 at the channel edge is also exposed.

Figure 7:
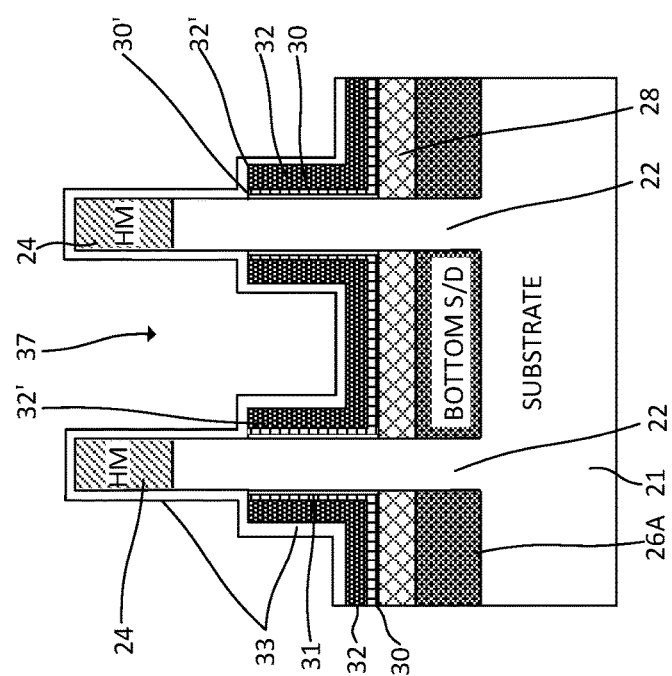
FIG. 7 is a schematic, cross-sectional view showing the structure of FIG. 6 following deposition of an oxygen barrier layer.

Referring to FIG. 7, an oxygen barrier layer 33 is deposited on the structure. The oxygen diffusion coefficient of the oxygen barrier layer 33 exceeds that of the gate dielectric layer 30. In an exemplary embodiment, a one to two nanometer (1-2 nm) layer of aluminum oxide ($Al_2O_3$) forms the oxygen barrier layer and is deposited using atomic layer deposition (ALD) over the exposed surfaces of the work function metal layer 32 and a hafnium oxide gate dielectric layer 30. Temperature is maintained between 200-350° C. during the deposition (ALD) process using water (H2O) as a carrier gas. Damage to the gate dielectric material and interfacial layer regrowth are avoided using such process conditions. Alternatively, CVD and PVD can be used for oxygen barrier layer deposition. CVD temperature ranges are similar to ALD and PVD is mostly done at room temperature. Aluminum oxide is a dielectric material known as having excellent oxygen barrier properties. Alternative materials that may be used to form the oxygen barrier layer include $Y_2O_3$, $SiO_2$, $Ta_2O_5$, $TiO_2$, $La_2O_3$, and a mixture of these materials, for example, $YSiO_x$, $LaSiO_x$, $TaSiO_x$, $TiSiO_x$, $LaYO_x$. In some embodiments, a bilayer oxygen barrier layer including two sublayers of different barrier materials can be used to enhance the efficacy of oxygen blocking.

Figure 8:
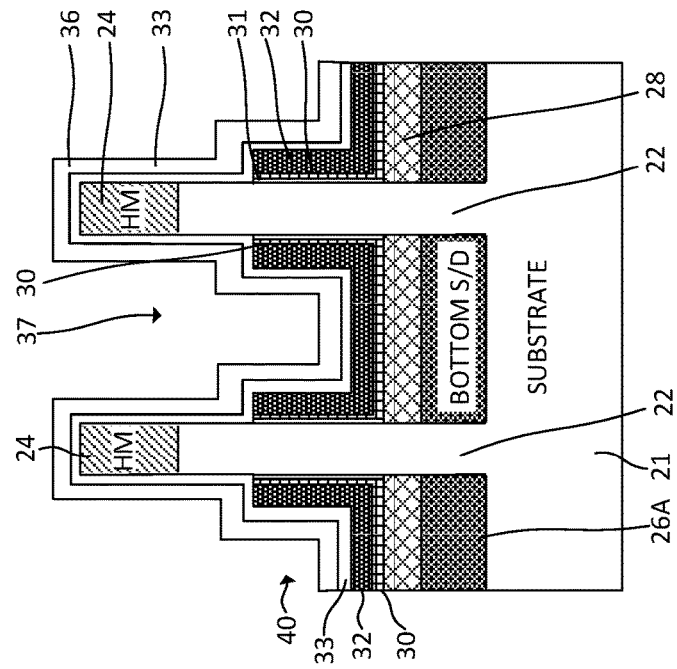
FIG. 8 is a schematic, cross-sectional view showing the structure of FIG. 7 following deposition of a top spacer layer.

Referring to FIG. 8, a dielectric gate encapsulation layer that functions as a top spacer 36 is deposited on the structure 35. The gate encapsulation layer is a silicon nitride layer in some embodiments in direct contact with the oxygen barrier layer. SiN is deposited by ALD under similar process conditions as used for deposition of the oxygen barrier layer. Residual oxygen in the SiN source would, in the absence of the oxygen barrier layer, cause the IL/HK/WFM damage or oxidation during deposition. The problems associated with SiN deposition arise because the deposition of a 100% SiN film has been infeasible. SiON (silicon oxynitride), SiBCN (silicon borocarbonitride), SiOCN (silicon oxycarbonitride), or SiOC (silicon oxycarbide) can alternatively be used to form the dielectric gate encapsulation layer without damaging or oxidizing underlying materials due to the presence of the oxygen barrier layer. The oxygen barrier layer 33, which covers the previously exposed sidewalls of the top regions of the fins 22, the top edges of the gate dielectric layers, and the top surface of the work function metal layer 32, protects these elements during spacer deposition. A structure 40 as schematically illustrated in FIG. 8 is obtained.

Figure 9:
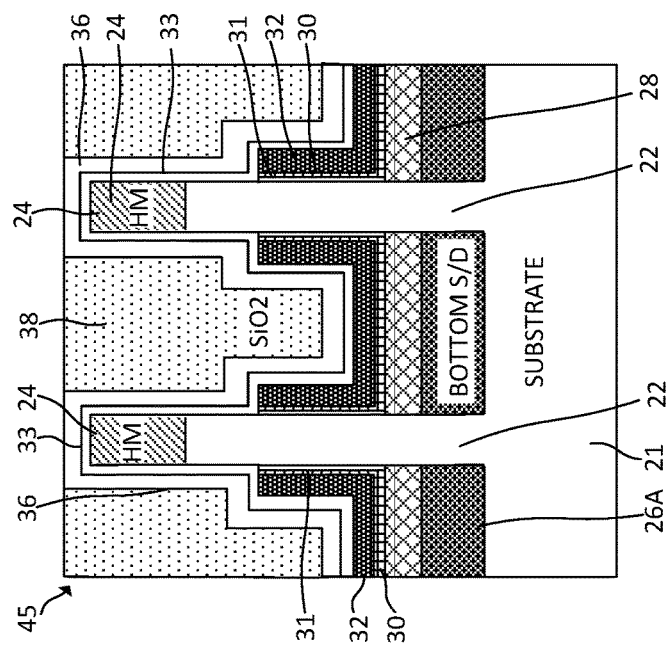
FIG. 9 is a schematic, cross-sectional view showing the structure of FIG. 8 following deposition of an oxide fill layer.

An oxide fill layer 38 is deposited over the gate encapsulation layer 36 and planarized to obtain a structure 45 as shown in FIG. 9. A chemical mechanical planarization (CMP) process may be employed to remove oxide fill material down to the top surface of the gate encapsulation/top spacer layer 36 above the semiconductor fins 22.

Figure 10:
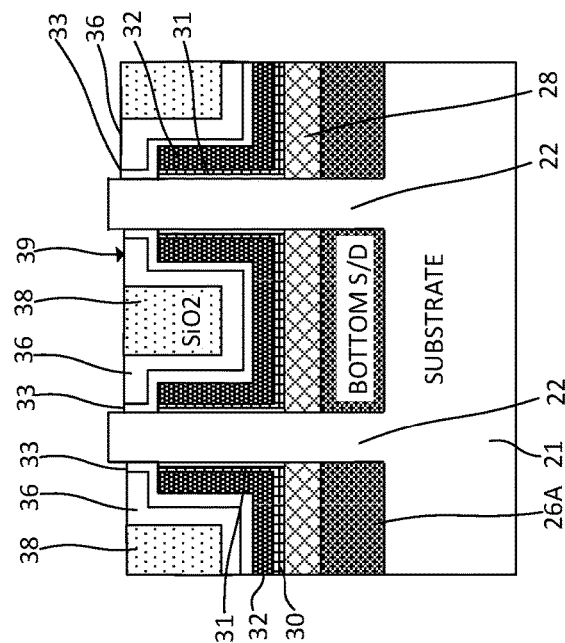
FIG. 10 is a schematic, cross-sectional view showing the structure of FIG. 9 following removal of material down to the semiconductor fins.

Sequential wet or dry etches, or combinations thereof, can be employed for etching the oxygen barrier layer 33, the work function metal, the hard mask (dielectric caps 24), and gate dielectric materials. Timed etches may be employed. As shown in FIG. 10, the dielectric caps 24 are completely removed from the semiconductor fins 22. Portions of the top spacer material and the oxygen barrier layer are removed such that top portions of the semiconductor fins 22 extending above the gate stacks (30/32) are exposed. Portions of the oxygen barrier layer 33 and the top spacer 32 extend over junction regions between the channel regions and top regions of the semiconductor fins 22.

Top source/drain regions 26B are epitaxially grown on the exposed surfaces of the top region of the semiconductor fin 22. Unlike the bottom source/drain regions 26A that are epitaxially grown as a layer on the substrate, the top source/drain regions form diamond-shaped, faceted structures. As discussed above, the semiconductor fin sidewall surfaces are (110) surfaces in one or more embodiments such that epitaxial growth thereon produces in diamond-shaped (faceted) structures due to the fact that the growth rate on (111) planes is considerably less than on (110) planes. The semiconductor fins 22 extend about six nanometers (6 nm) above the top surfaces of the top spacers 39 in some embodiments, which allows epitaxial growth of the top source/drain regions 26B on the (110) fin sidewalls. The exposed portions of the fin sidewalls on which top source/drain regions are grown can be in the range of about two to twenty nanometers (2-20 nm). Self-limiting diamond-shaped structures can accordingly be formed. In exemplary embodiments, the diamond-shaped top source/drain regions 26B are in situ doped silicon or silicon germanium and extend about ten nanometers (10 nm) laterally with respect to each vertical sidewall of the semiconductor fins 22. The doping levels may be about the same as those in the bottom source/drain regions. A structure 50 comprising a vertical transport field-effect transistor is thereby obtained, as schematically illustrated in FIG. 11.

Figure 12:
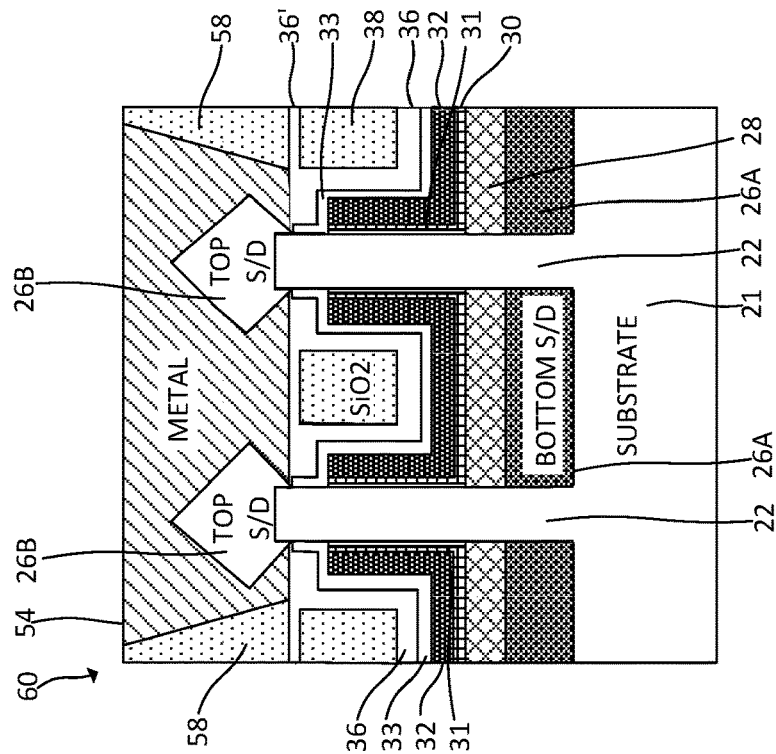
FIG. 12 is a schematic, cross-sectional view showing the structure of FIG. 12 following formation of top source/drain contacts.

Top source/drain contacts 54 are formed to obtain the structure 60 shown in FIG. 12. The source/drain contacts are formed using suitable metallization processes. In one or more embodiments, a metal such as nickel, nickel platinum, or titanium is deposited on the top source/drain regions 26B. Electroless deposition processes and atomic layer deposition (ALD) are among the techniques that may be employed. Metal deposition may be followed by low temperature silicidation to form metal silicide or metal germanide layers (not shown) on the top source/drain regions 26B. Annealing temperatures between 300-420° C. form uniform layers of metal-rich silicides. A contact metal layer, for example tungsten (W) or cobalt (Co), is deposited on the structure, filling cavities formed in an oxide layer and directly contacting the metal silicide layers formed on the top source/drain regions 26B. In some embodiments, the contact metal layer is a tungsten (W) layer that is deposited using a tungsten hexafluoride source with silane. Chemical vapor deposition conducted between 300-400° C. using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure. Gate and bottom source/drain contacts (not shown) are also formed within the structure.

Figure 11:
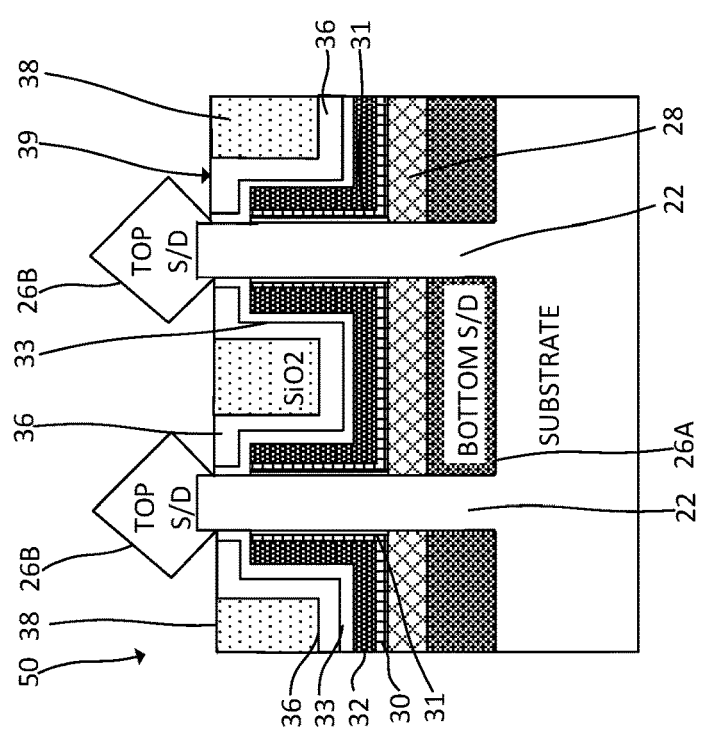
FIG. 11 is a schematic, cross-sectional view showing the structure of FIG. 11 following epitaxial growth of top source/drain regions.
Figure 13A:
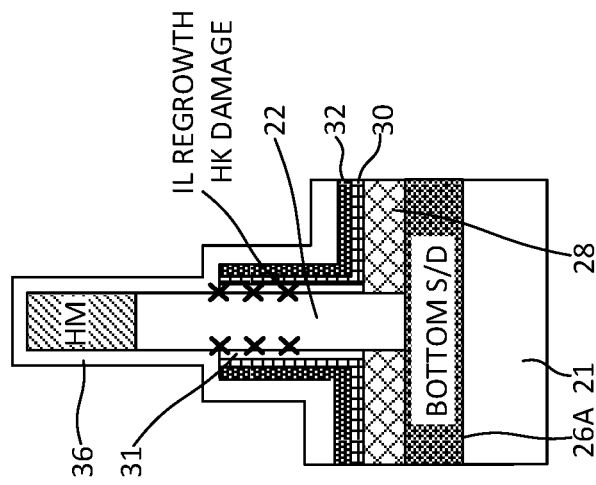
FIGS. 13A and 13B are schematic, cross-sectional views showing two stages of a prior art fabrication process for a VTFET.
Figure 13B:
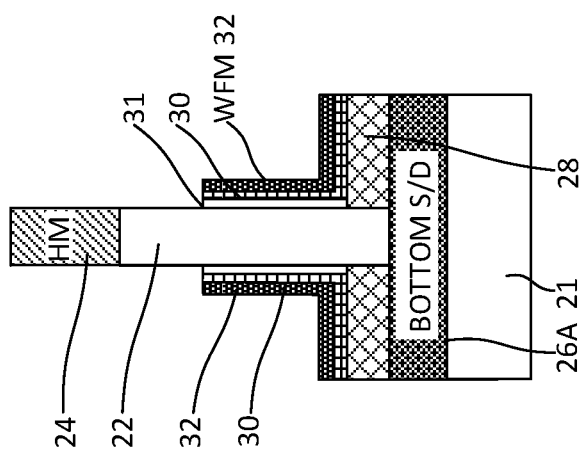

As shown in FIG. 12, a thin SiN liner (S/D liner 36') is deposited on the structure 50 shown in FIG. 11 prior to metal contact formation. An interlevel dielectric (ILD) layer 58 is deposited on the structure followed by a CMP process. The SiN liner 36' protects the top S/D regions 26B from oxidation during ILD deposition. The liner 36' can also function as an etch stop layer (due to the etch selectivity of SiN over $SiO_2$) when the top S/D metal contact trenches are formed in the ILD layer. The SiN liner 36' on top source/drain regions 26B can be removed selectively before silicide formation and contact metal fill.

The electronic devices comprising the structure 60 may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a vertical transport field-effect transistor includes obtaining a structure 35 as schematically illustrated in FIG. 6. The structure 35 includes a vertically extending semiconductor fin 22 including a top region, a bottom region, and a channel region between the top region and the bottom region. A bottom source/drain region 26A adjoins the bottom region of the semiconductor fin. A gate dielectric layer 30 adjoins the channel region of the semiconductor fin and an electrically conductive gate electrode layer 32 adjoins the gate dielectric layer, forming a gate stack. Each of the gate dielectric layer 30 and the gate electrode layer 32 includes exposed top edge portions 30', 32'. The top region of the semiconductor fin extends above the exposed top edge portions of the gate dielectric layer and the gate electrode layer. The structure 35 further includes a bottom electrically insulating spacer 28 between the bottom source/drain region 26A and the gate electrode layer 32. An oxidation barrier layer 33 is deposited on the first structure 35, the oxidation barrier layer extending over the gate electrode layer 32 and the exposed top edge portions 30', 32' of the gate dielectric layer 30 and the gate electrode layer 30, as schematically illustrated in FIG. 7. A top dielectric layer 36 is deposited on the oxidation barrier layer 33 to obtain a structure 40 as schematically illustrated in FIG. 8. A first portion of the oxidation barrier layer 33 and a first portion of the top dielectric layer 36 above the channel region of the semiconductor fin are removed during a top spacer pull down process, thereby exposing the top region of the semiconductor fin 22 as shown in FIG. 10. A top source/drain region 26B is epitaxially grown on the top region of the semiconductor fin 22 such that a second portion of the oxidation barrier layer 33 and a second portion of the top dielectric layer 36 comprise a top spacer 39 between the top source/drain region and the gate electrode layer, as schematically illustrated in FIG. 11. In one or more embodiments, the oxidation barrier layer is aluminum oxide and the top dielectric layer is a silicon nitride layer.

Further given the above discussion, a vertical transport field-effect transistor structure 50 includes a substrate 21 and a semiconductor fin 22 extending vertically with respect to the substrate. The semiconductor fin includes a top region, a bottom region, and a channel region between the top region and the bottom region. A bottom source/drain region 26A adjoins the bottom region of the semiconductor fin. A gate dielectric layer 30 adjoins the channel region of the semiconductor fin, the gate dielectric layer including top edge portions 30'. An electrically conductive gate electrode layer 32 adjoins the gate dielectric layer 30, the gate electrode layer including top edge portions 32'. A bottom dielectric spacer 28 is between the bottom source/drain region 26A and the gate electrode layer 32. A faceted, epitaxial top source/drain region 26B is on the top region of the semiconductor fin 22. An oxidation barrier layer 33 extends over the top edge portions 30', 32' of the gate dielectric layer 30, the length of the gate electrode layer 32, and a portion of the semiconductor fin 22 between the top source/drain region 26B and the top edge portions of the gate dielectric layer. A top dielectric layer 36 extends over the oxidation barrier layer 33. A portion of the oxidation barrier layer 33 and a portion of the top dielectric layer comprise a top spacer 39 positioned between the top source/drain region and the gate electrode layer. The oxidation barrier layer provides strong resistance to oxygen diffusion and thereby protects the underlying elements, including the gate electrode (WFM) layer, the gate dielectric layer, and the semiconductor fin from oxidation during deposition of the top dielectric material used to form the top spacer.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VTFETs therein.

An integrated circuit in accordance with aspects of the present disclosure can be employed in essentially any application and/or electronic system where the use of VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a vertical transport field-effect transistor structure, comprising:
    obtaining a first structure including:
        a vertically extending semiconductor fin including a top region, a bottom region, and a channel region between the top region and the bottom region,
        a bottom source/drain region adjoining the bottom region of the semiconductor fin,
        a gate dielectric layer adjoining the channel region of the semiconductor fin,
        an electrically conductive gate electrode layer adjoining the gate dielectric layer, each of the gate dielectric layer and the gate electrode layer including exposed top edge portions, the top region of the semiconductor fin extending above the exposed top edge portions of the gate dielectric layer and the gate electrode layer, and
        a bottom electrically insulating spacer between the bottom source/drain region and the gate electrode layer;
    depositing an oxidation barrier layer on the first structure, the oxidation barrier layer extending over the gate electrode layer and the exposed top edge portions of the gate dielectric layer and the gate electrode layer;
    depositing a top dielectric layer on the oxidation barrier layer;
    exposing the top region of the semiconductor fin, wherein exposing the top region of the semiconductor fin includes removing a first portion of the oxidation barrier layer and a first portion of the top dielectric layer above the channel region of the semiconductor fin;
    epitaxially growing a top source/drain region on the top region of the semiconductor fin such that a second portion of the oxidation barrier layer and a second portion of the top dielectric layer comprise a top spacer between the top source/drain region and the gate electrode layer.

2. The method of claim 1, wherein the oxygen barrier layer includes aluminum oxide.

3. The method of claim 2, wherein obtaining the first structure includes:
    epitaxially growing the bottom source/drain region directly on a semiconductor substrate;
    depositing the bottom electrically insulating spacer over the bottom source/drain region;
    depositing the gate dielectric layer directly on the bottom electrically insulating spacer and the semiconductor fin, and
    depositing the gate electrode layer directly on the gate dielectric layer.

4. The method of claim 3, wherein the top dielectric layer includes silicon nitride.

5. The method of claim 4, wherein the first structure further includes a dielectric cap on the semiconductor fin, further including removing the dielectric cap prior to epitaxially growing the top source/drain region.

6. The method of claim 5, wherein the semiconductor substrate comprises silicon.

7. The method of claim 1, wherein the semiconductor fin is integral with the semiconductor substrate, further wherein epitaxially growing the top source/drain region includes growing the top source/drain region on first and second sidewall portions of the semiconductor fin extending above the top spacer.

8. The method of claim 7, wherein the semiconductor fin extends about two to twenty nanometers above the top spacer.

* * * * *